US011749758B1

(12) United States Patent
Potera et al.

(10) Patent No.: US 11,749,758 B1
(45) Date of Patent: Sep. 5, 2023

(54) SILICON CARBIDE JUNCTION BARRIER SCHOTTKY DIODE WITH WAVE-SHAPED REGIONS

(71) Applicant: SemiQ Incorporated, Lake Forest, CA (US)

(72) Inventors: Rahul R. Potera, Irvine, CA (US); Carl A. Witt, Lake Forest, CA (US)

(73) Assignee: SEMIQ INCORPORATED, Lake Forest, CA (US)

(*) Notice: Subject to any disclaimer, the term of this patent is extended or adjusted under 35 U.S.C. 154(b) by 361 days.

(21) Appl. No.: 17/034,061

(22) Filed: Sep. 28, 2020

Related U.S. Application Data

(63) Continuation-in-part of application No. 16/675,161, filed on Nov. 5, 2019, now Pat. No. 10,950,695.

(51) Int. Cl.
*H01L 29/06* (2006.01)
*H01L 29/872* (2006.01)
*H01L 29/16* (2006.01)

(52) U.S. Cl.
CPC ........ *H01L 29/872* (2013.01); *H01L 29/0688* (2013.01); *H01L 29/1608* (2013.01)

(58) Field of Classification Search
CPC .................. H01L 29/66674–66734; H01L 29/7801–7826; H01L 29/04–045; H01L 29/16–1608; H01L 29/18–185; H01L 29/22–2206; H01L 29/36–365; H01L 29/0856–0869; H01L 29/0873–0886; H01L 29/1066; H01L 29/66901–66909; H01L 29/66916; H01L 29/66068; H01L 29/1058; H01L 29/66893–66924; H01L 29/8086; H01L 2924/13062; H01L 27/098; H01L 27/14679; H01L 2924/12032; H01L 29/66143; H01L 29/66212;
(Continued)

(56) References Cited

U.S. PATENT DOCUMENTS 3,775,200 A 11/1973 De Nobel et al.
4,543,595 A 9/1985 Vora
(Continued)

OTHER PUBLICATIONS

Wu et al. "Improving Surge Current Capability of SiC Merged PiN Schottky Diode by Adding Plasma Spreading Layers," IEEE Transactions on Power Electronics, vol. 35, No. Nov. 11, 2020, pp. 11316-11320, Date of Publication: Apr. 20, 2020.
(Continued)

*Primary Examiner* — Moin M Rahman
(74) *Attorney, Agent, or Firm* — The Law Offices of Bradley J. Bereznak

(57) ABSTRACT

A Junction Barrier Schottky (JBS) diode includes an N-type epitaxial layer disposed on SiC substrate, P+ wavy regions are disposed in the epitaxial layer adjoining a top planar surface, each of which is separated from an adjacent one of the wavy regions by a Schottky barrier contact region. P+ island regions are disposed in the Schottky barrier contact regions. A top metal layer is disposed along the top planar surface in direct contact with the Schottky barrier contact regions, the P+ wavy regions, and the P+ island regions, the top metal layer comprising the anode of the JBS diode. A bottom metal layer is disposed beneath the SiC substrate. The bottom metal layer comprises the cathode of the JBS diode.

18 Claims, 4 Drawing Sheets

(58) Field of Classification Search
CPC ..... H01L 29/872–8725; H01L 27/0766; H01L 51/0579; H01L 29/6603; H01L 29/6606
See application file for complete search history.

(56) References Cited

U.S. PATENT DOCUMENTS

| | | | |
|---|---|---|---|
| 4,745,445 A | 5/1988 | Mun et al. | |
| 4,946,547 A | 8/1990 | Palmour et al. | |
| 5,200,022 A | 4/1993 | Kong et al. | |
| 5,602,418 A | 2/1997 | Imai et al. | |
| 5,612,567 A | 3/1997 | Baliga | |
| 5,686,738 A | 11/1997 | Moustakas | |
| 5,703,389 A | 12/1997 | Knoch et al. | |
| 5,741,724 A | 4/1998 | Ramdani et al. | |
| 5,785,606 A | 7/1998 | Marquez | |
| 5,874,747 A | 2/1999 | Redwing et al. | |
| 5,877,558 A | 3/1999 | Nakamura et al. | |
| 6,051,340 A | 4/2000 | Kawakami et al. | |
| 6,121,121 A | 9/2000 | Koide | |
| 6,139,628 A | 10/2000 | Yuri et al. | |
| 6,146,457 A | 11/2000 | Solomon | |
| 6,184,570 B1 | 2/2001 | MacDonald, Jr. et al. | |
| 6,239,033 B1 | 5/2001 | Kawai | |
| 6,685,804 B1 | 2/2004 | Ikeda et al. | |
| 7,026,665 B1 | 4/2006 | Smart et al. | |
| 7,235,330 B1 | 6/2007 | Fujimoto et al. | |
| 7,547,928 B2 | 6/2009 | Germain et al. | |
| 7,696,540 B2 | 4/2010 | Francis et al. | |
| 7,696,598 B2 | 4/2010 | Francis et al. | |
| 8,653,534 B2 | 2/2014 | Zhang et al. | |
| 8,901,699 B2 | 12/2014 | Ryu et al. | |
| 2002/0015833 A1 | 2/2002 | Takahashi et al. | |
| 2003/0015708 A1 | 1/2003 | Parikh et al. | |
| 2004/0016965 A1 | 1/2004 | Ui et al. | |
| 2004/0021152 A1 | 2/2004 | Nguyen et al. | |
| 2004/0119063 A1 | 6/2004 | Guo et al. | |
| 2005/0087763 A1 | 4/2005 | Kanda et al. | |
| 2006/0108606 A1 | 5/2006 | Saxler et al. | |
| 2006/0151868 A1 | 7/2006 | Zhu et al. | |
| 2006/0186422 A1 | 8/2006 | Gaska et al. | |
| 2006/0244010 A1 | 11/2006 | Saxler | |
| 2009/0191674 A1 | 7/2009 | Germain et al. | |
| 2009/0289262 A1* | 11/2009 | Zhang | H01L 29/872 257/E21.057 |
| 2015/0001549 A1* | 1/2015 | Miura | H01L 29/66045 257/76 |
| 2018/0026132 A1 | 1/2018 | Cooper, Jr. | |
| 2018/0096991 A1 | 4/2018 | Nasu et al. | |
| 2019/0252497 A1 | 8/2019 | Chao et al. | |
| 2021/0296512 A1* | 9/2021 | Song | H01L 29/6606 |

OTHER PUBLICATIONS

Rupp et al. "Avalanche Behavior and its Temperature Dependence of Commercial SiC MPS Diodes: Influence of Design and Voltage Class," Proceedings of the 26th International Symposium on Power Semiconductor Devices & ICs, Jun. 15-19, 2014, Waikoloa, Hawaii pp. 67-70.

* cited by examiner

SILICON CARBIDE JUNCTION BARRIER SCHOTTKY DIODE WITH WAVE-SHAPED REGIONS

RELATED APPLICATIONS

The present application is a continuation-in-part (CIP) application of U.S. patent application Ser. No. 16/675,161, filed Nov. 5, 2019, entitled, "Silicon Carbide Planar MOSFET With Wave-Shaped Channel Regions", the entirety of which is hereby incorporated by reference.

TECHNICAL FIELD

The present disclosure relates to silicon carbide power semiconductor devices. More specifically, the present invention relates to Junction Barrier Schottky (JBS) diode structures capable of withstanding high voltages.

BACKGROUND

The Schottky diode is a well-known semiconductor diode device that is achieved using an N-type semiconductor to a metal plate junction, frequently referred to as a Schottky barrier. In contrast, in an ordinary PN junction diode the junction is formed between a P-type semiconductor to an N-type semiconductor. Compared with silicon-based PIN diodes, silicon carbide (SiC) Schottky barrier diodes (SBDs) are characterized by lower switching losses and very fast switching speed. However, SiC devices, due to their wider bandgap, are optimized to operate at higher electric fields. The leakage current across the reverse-biased metal-semiconductor junction in the SiC SBD at this higher electric field is much higher than leakage across a PN junction of the same barrier in a Si PIN diode.

Switching loss is low because, unlike silicon PIN diodes, SiC SBDs are majority carrier devices that do not inject minority carriers into the N-type drift region. The Schottky barrier diode has electrons as majority carriers on both sides of the junction. Since there is no depletion layer formed near the junction, the forward voltage drop ($V_F$) is less compared to an ordinary PN junction diode. In addition, since the majority carriers do not need to be removed to switch the device off, the reverse current transient during switching is small and the switching energy is negligible. This reduction in switching energy has led to SiC SBDs replacing silicon PIN diodes in many power applications such as the front-end boost converter in switched-mode power supplies.

Silicon SBDs are generally unsuitable for high voltage operation because their reverse leakage current is relatively high, leading to high off-state power dissipation. Even though the leakage current is much smaller in SiC SBDs as compared to silicon SBDs, reverse leakage in SiC SBDs may still be a performance limitation in certain applications. The leakage is due to electrons that enter the semiconductor material from the metal by thermionic-field emission (TFE) under reverse bias. This leakage current increases exponentially with the electric field at the metal-semiconductor interface, i.e., where the semiconductor material directly contacts the metal forming the anode of the diode. The electric field is given by the slope of the conduction band at the surface.

Prior attempts to reduce the reverse leakage current in SiC SBDs have focused on reducing the electric field at the surface. One past approach has been to place isolated $P^+N$ junctions within the active area of the SBD. Such devices are commonly referred to as Junction-Barrier Schottky (JBS) diode structures. In JBS diodes, many of the electric field lines reaching the surface terminate on $P^+N$ junctions rather than on the Schottky barrier junction, thus reducing the surface electric field and hence lowering the reverse leakage current. One drawback of this approach, however, is that the insertion of $P^+N$ junctions increases the overall area of the diode for the same current-carrying area of the Schottky junction, and thus increases the specific on-resistance in forward bias, and capacitance in reverse bias.

Silicon carbide JBS diodes are commonly utilized in power switching applications where surge currents are typically experienced during power on. Because surge currents have the potential to damage the Schottky barrier junction, various designs have been adopted that turn on the $P^+N$ junctions, resulting in the injection of minority carriers into the N-type drift layer, which reduces the power dissipated in the device, and hence the potential of device failure due to the current surge. Prior art JBS diodes have employed different layout designs, e.g., hexagonal shaped P-type regions, that attempt to mitigate the problem of current surge. One problem with these past approaches is that they can undesirably increase the on-resistance of the device at low currents and/or increase the forward voltage drop.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
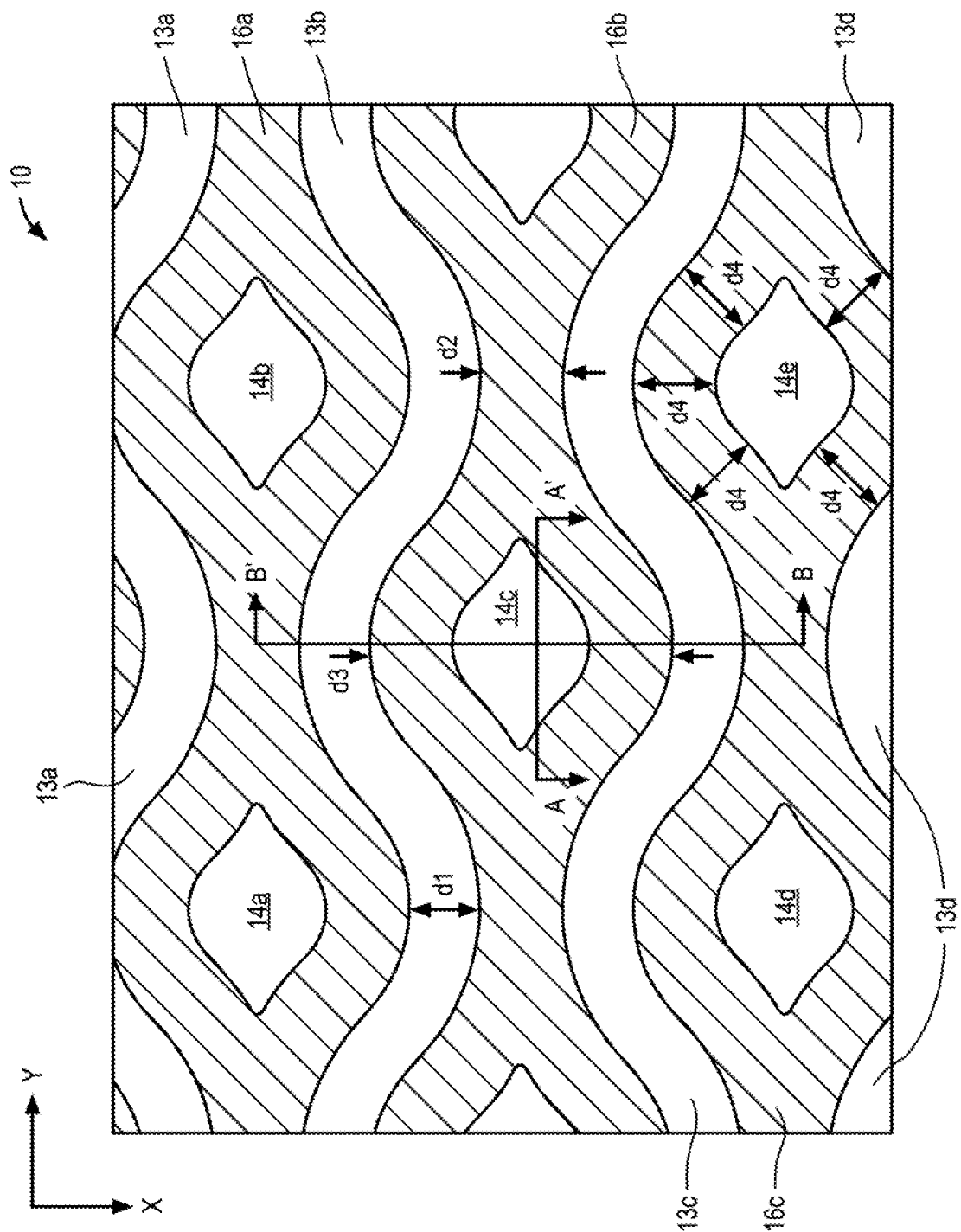
FIG. 1 is a top level view of an example layout for a SiC JBS diode with serpentine or wave-shaped regions.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the disclosed subject matter. Also, common but well-understood elements that are useful or necessary in a commercially feasible embodiment are often not depicted in order to facilitate a less obstructed view of these various embodiments presented. Additionally, persons of skill in the semiconductor arts will understand that regions and elements depicted in cross-sectional diagrams should not be limited to the particular shapes of the regions illustrated. For instance, implanted regions shown in rectangular form typically have rounded or curved features due to normal fabrication processing. Thus, the shapes of regions shown in the drawings are not intended to illustrate the precise shapes found in a manufactured device.

DETAILED DESCRIPTION

In the following description numerous specific details are set forth in order to provide a thorough understanding of the disclosed subject matter. It will be apparent, however, to one having ordinary skill in the art that the specific details need not be employed to practice the various embodiments described. In other instances, well-known systems, devices, or methods have not been described in detail in order to avoid obscuring the disclosed subject matter.

Reference throughout this specification to "one embodiment", "an embodiment" "one example" or "an example" means that a particular feature, structure or characteristic described in connection with the embodiment or example is included in at least one embodiment of the disclosed subject matter. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanatory purposes to persons ordinarily skilled in the art and that the drawings are not necessarily drawn to scale.

As used herein, a "wafer" is a thin slice of crystalline material, such as silicon carbide, used in the fabrication of semiconductor devices and integrated circuits. The term "substrate" refers to the semiconductor supporting material upon which or within which the elements of a semiconductor device are fabricated, which substantially comprises the thickness of a wafer. Upon completion of the fabrication process the wafer is typically scribed and broken into individual semiconductor die, each of which consists of one or more semiconductor devices.

In the context of the present application, when a diode is in an "off state" or "off" the diode does not substantially conduct current. Conversely, when a diode is in an "on state" or "on" the diode is able to substantially conduct current in a forward-biased direction.

It is appreciated that each of the diode structures shown and disclosed herein may represent a single device cell or unit. Each of the diode cells shown may be replicated in a mirrored or translated fashion many times in two-dimensional layouts across a wafer to form a completely fabricated SiC device.

A SiC JBS diode device structure having a layout with serpentine or wave-shaped regions is described. In one embodiment, the wave-shaped regions comprise heavily-doped P+ regions that extend in a first lateral direction. Each of the P+ wavy regions is separated in a second lateral direction by a Schottky region. Disposed in the widest areas of the Schottky region that separates adjacent P+ wavy regions is a P+ island region. The SiC JBS diode device structure layout advantageously reduces voltage drop in the on-state. In the off-state, the negatively-charged acceptors in the depleted P+ regions reduce the electric field at the Schottky metal interface, thus reducing the reverse leakage.

FIG. 1 is a top level view of an example layout of a SiC JBS diode 10 fabricated in a SiC wafer. As shown, JBS diode 10 includes wave-shaped, or wavy, regions 13 which comprise heavily-doped P+ regions that extend laterally across the top planar surface of the substrate in the X and Y directions in a wave-shaped pattern. Neighboring P+ wavy regions 13 are separated laterally in the X direction by a Schottky barrier contact region 16. For example, in the X direction, Schottky barrier contact region 16a separates P+ wavy regions 13a & 13b; Schottky contact region 16b separates P+ wavy regions 13b & 13c; and Schottky contact region 16c separates P+ wavy regions 13b & 13c.

Note that in the embodiment shown, each P+ wavy region 13 has a lateral width d1 in the X direction that is constant along the extended length of the P+ wavy region 13 in the Y direction. The wave-shape is characterized by symmetrical semi-circular or curved regions that continuously alternate orientation by 180 degrees in a serpentine manner along the extended lateral Y-direction. Practitioners in the art will appreciate that in the X direction neighboring P+ wavy regions 13 are 180 degrees out-of-phase. That is, laterally adjacent P+ wavy regions 13 are alternately separated in the X direction by a maximum distance d3 and a minimum distance d2.

Continuing with the example of FIG. 1, a P+ island region 14 is centrally disposed in the area of each Schottky contact region 16 where adjacent P+ wavy regions 13 are separated by the maximum distance d3. For instance, P+ island regions 14a & 14b are respectively disposed in the wide areas of Schottky region 16a separating P+ wavy regions 13a & 13b; P+ island region 14c is disposed in the central wide area of Schottky region 16b separating P+ wavy regions 13b & 13c; and P+ island regions 14d & 14e are respectively disposed in the wide areas of Schottky region 16c separating P+ wavy regions 13c & 13d.

In the example shown, each of P+ island regions 14 has a lemon-shape (i.e., a circular arc of angle less than half of a full circle where the endpoints of the arc are extended in the Y direction), wherein any tangential point on the perimeter of P+ island region 14 is a predetermined distance d4 from a nearest adjacent P+ wavy region 13. It is appreciated that in other embodiments, P+ island regions 14 may have different layout shapes, e.g., circular, elliptical, oval, etc.

In various embodiments of SiC JBS diode 10 the distance d1 may be in a range of 0.5 µm to 2.0 µm; distance d2 in a range of 1.0 µm to 3.0 µm; distance d3 in a range of 2.5 µm to 8.0 µm; and distance d4 may be in a range of 1.0 µm to 3.0 µm.

Persons of skill in the art will understand that the portion of the JBS diode layout shown In FIG. 1 includes a single BS diode cell that may be replicated in a mirrored or translated fashion many times in both the X and Y lateral directions across a wafer or die to form a complete SiC JBS diode device. Thus, there may be repetitions of the wave-shaped P+ regions and P+ island regions across the semiconductor wafer or die. In the layout shown in FIG. 1, a single diode cell may be defined as a square region that includes P+ island 14c and extends laterally in the X and Y directions to include an equal fractional portion (i.e., %) of P+ island regions 14a, 14b, 14d and 14e. In the example of FIG. 1 the distance between P+ island 14c and any one of P+ islands 14a, 14b, 14d and 14e (as measured center-to-center on a 45 degree angle) is the same.

Alternatively, a single JBS diode cell may be defined as a smaller square area that includes a ½ portion of four P+ islands 14 where the nearest island portions are located on a 45 degree angle of an X-Y grid.

Figure 2:
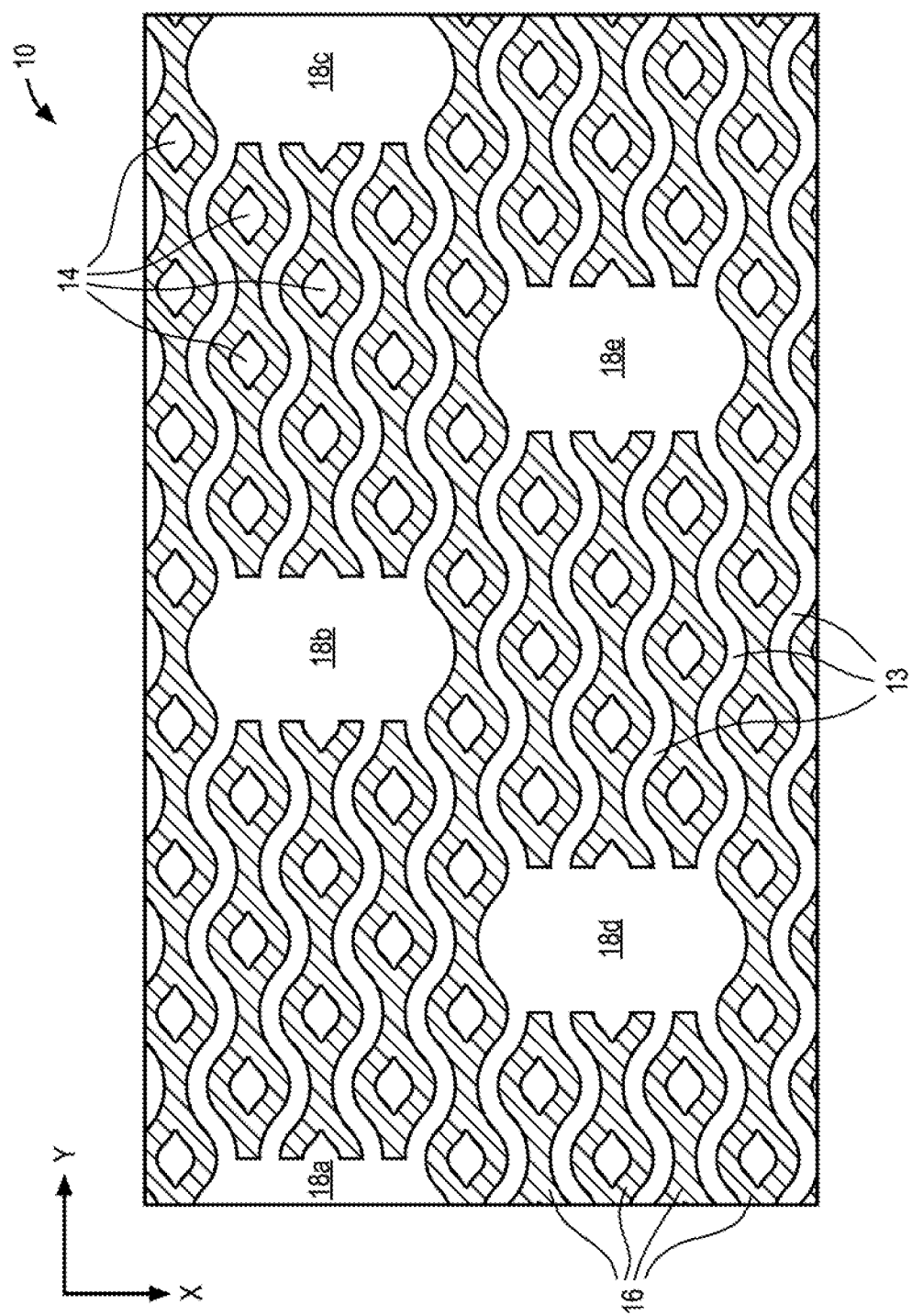
FIG. 2 is a zoomed out view of the layout of FIG. 1 showing a plurality of SiC JBS diode cells with large island areas.

FIG. 2 is a zoomed out view of the layout of FIG. 1 showing SiC JBS diode 10 comprising a plurality of JBS diode cells as described above. Also included are several substantially larger P+ island regions 18 to accommodate surge current. Surge current begins to flow first across the P+N junction formed by region 18 with layer 33 at the point farthest from nearby Schottky regions, which means that having large area P+ island regions 18 causes surge current to flow at a lower forward voltage as compared to the P+N junctions formed by second regions 14 with epitaxial layer 33.

The top view of FIG. 2 includes large P+ island regions 18a, 18b and 18c arranged in a top row. Large P+ island regions 18d and 18e are arranged in a bottom row with the locations of the large P+ regions 18 being staggered (e.g., 45 degrees) as between the two rows. Large P+ regions 18 in each row are shown merged with a plurality of P+ wavy regions 13 and P+ island regions 14. As shown, adjacent large P+ regions 18 in each row are separated by a plurality (e.g., three) of small JBS diode cells.

It is appreciated that in certain embodiments, the separation of the large P+ island regions 18 may be larger, or smaller. It is further appreciated that each of the spaced-apart P+ island regions 18 is disposed in the epitaxial layer adjoining the top planar surface. In one embodiment, each large P+ island region has a length that extends in the first lateral direction across two or more of the P+ wavy regions 13, and a width in the second direction that extends across two or more of the P+ island regions 14.

In one embodiment the PN junction formed by the large P+ regions 18 and the underlying N-type epitaxial layer turns on at a much lower voltage (e.g., 4-5 V) as compared with that of the Schottky regions 18 (e.g., 8-9 V). The combination of the large areas provided by the large P+ regions 18 and their low turn-on voltage advantageously protects the device from potential damage due to the high voltage and high power dissipation that would result from surge current flowing across the Schottky barrier.

Practitioners of ordinary skill with appreciate that the SiC JBS diode device structure with wave-shaped regions shown in FIGS. 1 and 2 provides improved performance over traditional JBS diode designs. The areas of improved performance include high surge current capability, low forward voltage drop, smaller cell pitch, and optimized reverse leakage current.

Figure 3:
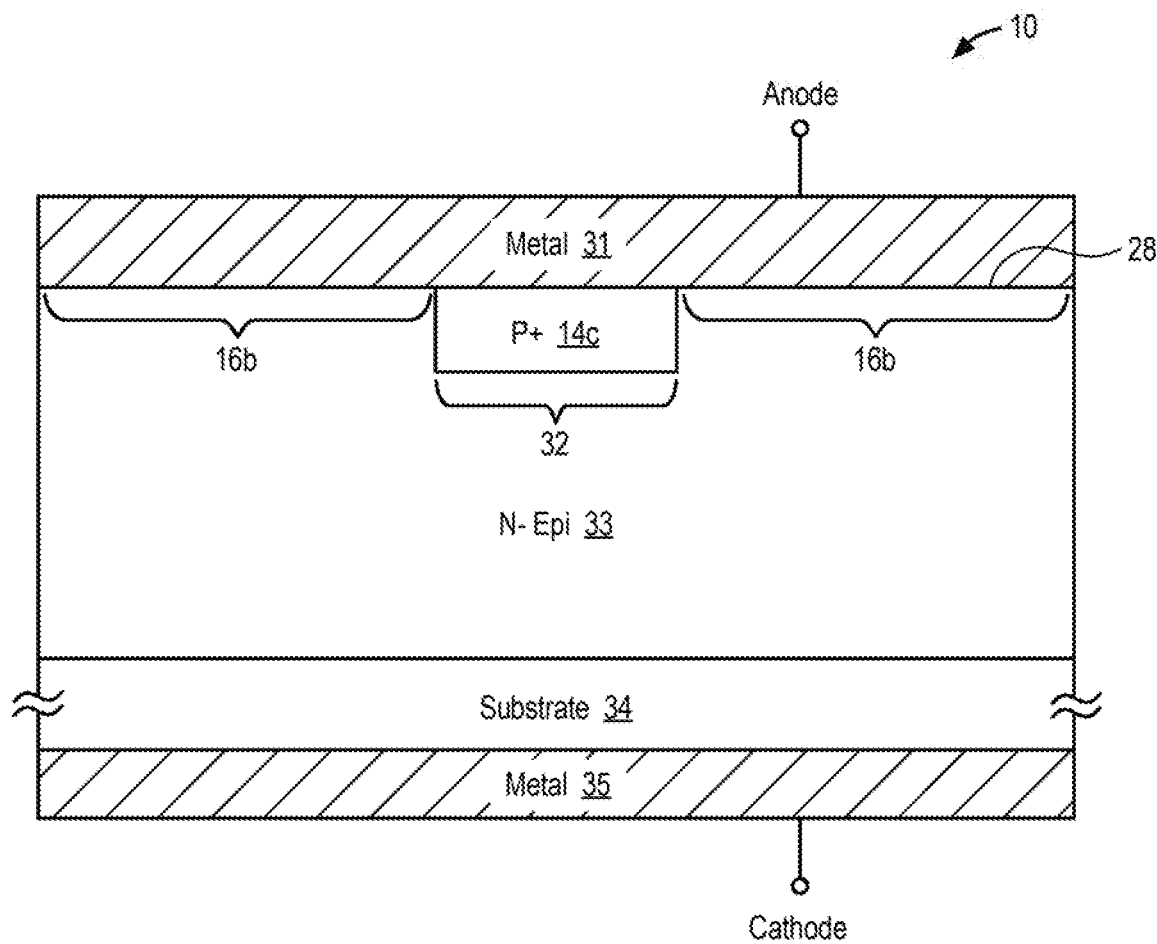
FIG. 3 is an example cross-sectional diagram of the SiC JBS diode layout shown in FIG. 1, as taken along cut lines A-A'.

FIG. 3 is an example cross-sectional diagram of the SiC JBS diode layout shown in FIG. 1, as taken along cut lines A-A'. As shown, JBS diode 10 includes highly-doped P+ island region 14c disposed in N-type epitaxial layer 33 directly beneath top planar substrate surface 28 and in direct contact with top metal layer 31. A P+N junction 32 is shown located at the bottom of P+ island region 32. Metal layer 31, which forms the anode of JBS diode 10, may comprise titanium or another suitable Schottky metal, e.g., molybdenum nitride.

P+ island regions 14 and large P+ island regions 18 (not shown in this cross-section) may be formed by ion implantation to a doping concentration in a range of about 1E18/cm$^3$ to 1E20/cm$^3$. The depth of P+ island regions 14 may be in a range of about 0.4 µm to 2.0 µm below top surface 28. Schottky barrier contact regions 16b are shown disposed on opposite lateral sides of P+ island region 14c in the area where metal 31 contacts the underlying N-type epitaxial layer 33. N-type epitaxial layer 33 is formed above an N-type substrate 34. A bottom metal layer 35, which forms the cathode of JBS diode 10, is in electrical contact with the bottom of substrate 34.

In one embodiment, for a 1200 volt diode N-type epitaxial layer 33 may have a doping concentration of about 9E15/cm$^3$ and a thickness of about 10 µm. SiC substrate 34 may have a doping concentration of about 4E18/cm$^3$ and a thickness in a range of 100 µm to 360 µm. In other embodiments, the N-type epitaxial layer 33 may have a graded doping profile in the vertical direction, where the doping concentration changes from near top planar surface 28 down to substrate 34. In still other embodiments, an additional higher doped N+ region may be disposed beneath top planar surface 28 and above N-type epitaxial layer 33.

It is appreciated that P+ island regions 14 in combination with P+ wavy regions 13 effectively reduce the electric field at Schottky contact regions 16 during reverse bias (off-state) without adversely impacting forward bias (on-state) current.

Figure 4:
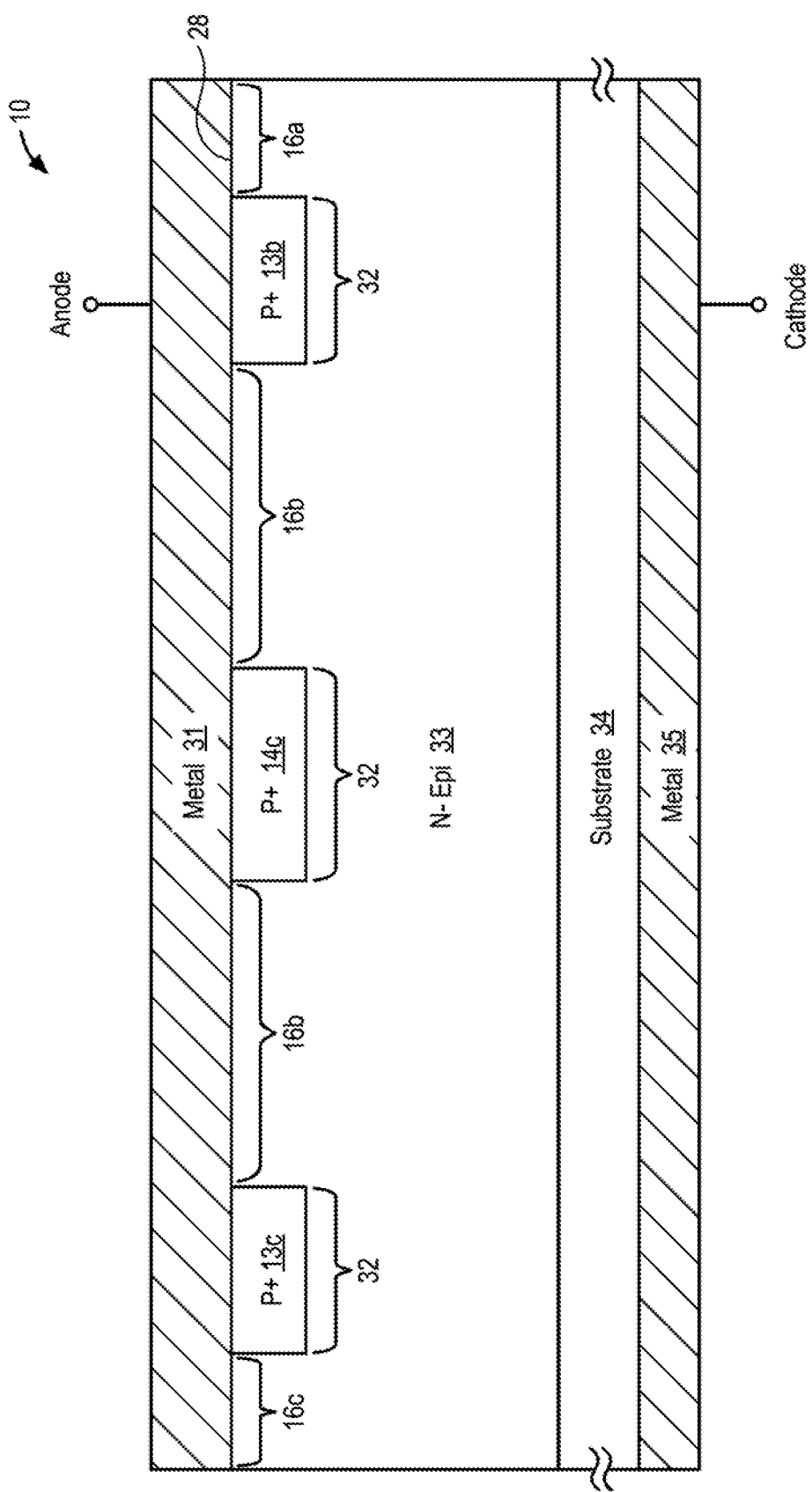
FIG. 4 is an example cross-sectional diagram of the SiC JBS diode layout shown in FIG. 1, as taken along cut lines B-B'.

FIG. 4 is an example cross-sectional diagram of the SiC JBS diode layout shown in FIG. 1, as taken along cut lines B-B'. In this view, P+ wavy regions 13b & 13c are disposed in N-type epitaxial layer 33 on opposite lateral sides of P+ island region 14c. Schottky contact regions 16b separate P+ island region 14 from P+ wavy regions 13b & 13c. Schottky contact region 16a laterally adjoins the right-hand side of P+ wavy region 13b, whereas Schottky contact region 16c laterally adjoins the left-hand side of P+ wavy region 13c. A P+N junction 32 is formed at the bottom of each of the P+ regions 13b, 13c, and 14c. Top metal layer 31 is shown on top planar surface 28 making electrical contact with P+ regions 13b, 13c, 14c as well as Schottky contact regions 16a, 16b, and 16c.

The above description of illustrated example embodiments, including what is described in the Abstract, are not intended to be exhaustive or to be limited to the precise forms or structures disclosed. While specific embodiments and examples of the subject matter described herein are for illustrative purposes, various equivalent modifications are possible without departing from the broader spirit and scope of the present invention. Indeed, it is appreciated that the specific example thicknesses, material types, concentrations, voltages, etc., are provided for explanatory purposes and that other values may also be employed in other embodiments and examples in accordance with the teachings of the present invention.

We claim:

1. A Junction Barrier Schottky (JBS) diode comprising:
a silicon carbide (SiC) substrate of a first conductivity type;
an epitaxial layer of the first conductivity type disposed above the SiC substrate and extending up to a top planar surface, the epitaxial layer including a plurality of Schottky barrier contact regions;
a plurality of first regions of a second conductivity type, the first regions being disposed in the epitaxial layer adjoining the top planar surface and extending downward to a depth, each of the first regions having a wave-shaped pattern across the top planar surface, the wave-shaped pattern extending in first and second lateral directions, each of the first regions being separated from an adjacent one of the first regions by one of the Schottky barrier contact regions;
a plurality of second regions of the second conductivity type each of which is laterally surrounded by a Schottky barrier contact region, each of the second regions being separated from an adjacent first region by a predetermined distance;
a top metal layer disposed along the top planar surface in direct contact with the Schottky barrier contact regions and the first and second regions, the top metal layer comprising an anode of the JBS diode;
a bottom metal layer disposed beneath the SiC substrate, the bottom metal layer comprising a cathode of the JBS diode; and
wherein the wave-shaped pattern comprise semi-circular regions that extend in the first and second lateral directions, with the semi-circular regions alternating orientation by 180 degrees along the second lateral direction.

2. The JBS diode of claim 1 wherein the wave-shaped pattern of adjacent first regions are arranged 180 degrees out of phase with one another such that the adjacent first regions are alternately separated in the first lateral direction by a minimum distance and a maximum distance as the adjacent first regions extend along the second lateral direction.

3. The JBS diode of claim 2 wherein each of the second regions is centrally disposed in an area of a corresponding Schottky barrier contact region where the adjacent first regions are separated by the maximum distance.

4. The JBS diode of claim 3 wherein each of the second regions has a lemon-shaped cross-section in the first and second lateral directions.

5. The JBS diode of claim 4 wherein any point on a perimeter of the lemon shaped cross-section is a fixed distance from an adjacent first region.

6. The JBS diode of claim 1 further comprising a plurality of spaced-apart island regions of the second conductivity type disposed in the epitaxial layer adjoining the top planar surface, the island regions having a length that extends in the first lateral direction across two or more of the first regions, and a width in the second direction that extends across two or more of the second regions, each island region being merged with the two or more of the first regions, the top metal layer being in direct contact with the island regions.

7. The JBS diode of claim 6 wherein the first conductivity type is N-type and the second conductivity type is P-type.

8. The JBS diode of claim 7 wherein the top metal layer ohmically contacts each of the island regions such that each of the island regions forms a P+N junction with the epitaxial layer, the P+N junction turning on at a lower voltage as compared with P+N junctions formed by the second regions with the epitaxial layer.

9. A Junction Barrier Schottky (JBS) diode comprising:
a silicon carbide (SiC) substrate of a first conductivity type;
a layer of the first conductivity type disposed above the SiC substrate and extending down from a top planar surface, the layer including a plurality of Schottky barrier contact regions;
a plurality of first regions of a second conductivity type, the first regions being disposed in the layer adjoining the top planar surface and extending downward to a depth, each of the first regions having a wave-shaped pattern across the top planar surface, the wave-shaped pattern extending in first and second lateral directions, each of the first regions being separated from an adjacent one of the first regions by one of the Schottky barrier contact regions;
a plurality of second regions of the second conductivity type each of which is laterally surrounded by a Schottky barrier contact region, each of the second regions extending downward to the depth, each of the second regions being separated from an adjacent first region by a predetermined distance;
a top metal layer disposed along the top planar surface in ohmic contact with the Schottky barrier contact regions and the first and second regions, the top metal layer comprising an anode of the JBS diode;
a bottom metal layer disposed beneath the SiC substrate, the bottom metal layer comprising a cathode of the JBS diode; and
wherein the wave-shaped pattern comprise semi-circular regions that extend in the first and second lateral directions, with the semi-circular regions alternating orientation by 180 degrees along the second lateral direction.

10. The JBS diode of claim 9 wherein the wave-shaped pattern of adjacent first regions are arranged 180 degrees out of phase with one another such that the adjacent first regions are alternately separated in the first lateral direction by a minimum distance and a maximum distance as the adjacent first regions extend along the second lateral direction.

11. The JBS diode of claim 10 wherein each of the second regions is centrally disposed in an area of a corresponding Schottky barrier contact region where the adjacent first regions are separated by the maximum distance.

12. The JBS diode of claim 10 wherein the minimum distance is in a range of 1.0 µm to 3.0 µm, and the maximum distance is in a range of 2.5 µm to 8.0 µm.

13. The JBS diode of claim 12 wherein the predetermined distance is in a range of 1.0 µm to 3.0 µm.

14. The JBS diode of claim 9 further comprising a plurality of spaced-apart island regions of the second conductivity type disposed in the layer adjoining the top planar surface, the island regions having a length that extends in the first lateral direction across two or more of the first regions, and a width in the second direction that extends across two or more of the second regions, each island region being merged with the two or more of the first regions, the top metal layer being in ohmic contact with the island regions.

15. The JBS diode of claim 14 wherein the first conductivity type is N-type and the second conductivity type is P-type.

16. The JBS diode of claim 15 wherein each of the island regions forms a P+N junction with the layer, the P+N junction turning on at a lower voltage as compared with the P+N junctions formed by the second regions with the layer of the first conductivity type.

17. The JBS diode of claim 9 wherein the layer comprises an epitaxial layer.

18. The JBS diode of claim 9 wherein the depth is in a range of 0.4 µm to 2.0 µm beneath the top planar surface.

* * * * *